(12) United States Patent
Vashchenko et al.

(10) Patent No.: US 8,344,394 B1
(45) Date of Patent: Jan. 1, 2013

(54) HIGH-SPEED AVALANCHE LIGHT EMITTING DIODE (ALED) AND RELATED APPARATUS AND METHOD

(75) Inventors: Vladislav Vashchenko, Palo Alto, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 769 days.

(21) Appl. No.: 12/584,904

(22) Filed: Sep. 15, 2009

(51) Int. Cl.
*H01L 33/00* (2010.01)

(52) U.S. Cl. .................. 257/88; 257/83; 257/93

(58) Field of Classification Search .............. 257/78–98, 257/435–438
See application file for complete search history.

(56) References Cited

U.S. PATENT DOCUMENTS

| | | | |
|---|---|---|---|
| 5,448,082 A | 9/1995 | Kim | |
| 5,691,558 A | 11/1997 | Davies | |
| 6,107,644 A | 8/2000 | Shakuda et al. | |
| 6,809,340 B2 | 10/2004 | Kato et al. | |
| 7,056,761 B1 | 6/2006 | Vashchenko et al. | |
| 7,075,133 B1 | 7/2006 | Padmanabhan et al. | |
| 7,154,124 B2 | 12/2006 | Han et al. | |
| 7,375,383 B2 | 5/2008 | Nakamura et al. | |
| 7,462,874 B1 | 12/2008 | Hopper et al. | |
| 7,592,637 B2 * | 9/2009 | Zimmerman et al. ........ | 257/98 |
| 7,915,622 B2 * | 3/2011 | Wang ............................. | 257/88 |
| 8,129,710 B2 * | 3/2012 | Cho et al. ...................... | 257/13 |
| 2006/0214172 A1* | 9/2006 | Hsu et al. ...................... | 257/88 |
| 2011/0018011 A1* | 1/2011 | Beeson et al. ................. | 257/89 |

OTHER PUBLICATIONS

Lukas W. Snyman, et al., "A Dependency of Quantum Efficiency of Silicon CMOS n+pp+LEDs on Current Density." IEEE Photonics Technology Letters, vol. 17, No. 10, Oct. 2005, pp. 2041-2043.

Amjad T. Obeidat, et al., "A model for visible photon emission from reverse-biased silicon p-n junctions", Appl. Phys. Lett. 70(4) Jan. 27, 1997, p. 470-471.

M. Morschbach, et al., "Visible Light Emission by a Reverse-Biased Integrated Silicon Diode", IEEE Transactions on Electron Devices, vol. 54, No. 5, May 2007, p. 1091-1094.

* cited by examiner

*Primary Examiner* — Tung X Le
(74) *Attorney, Agent, or Firm* — Wade J. Brady, III; Frederick J. Telecky, Jr.

(57) ABSTRACT

A circuit includes multiple doped regions in a substrate. A first of the doped regions has a tip proximate to a second of the doped regions and is separated from the second doped region by an intrinsic region to form a P-I-N structure. The circuit also includes first and second electrodes electrically coupled to the first and second doped regions, respectively. The electrodes are configured to supply voltages to the first and second doped regions to reverse bias the P-I-N structure and generate light. The first doped region could include multiple tips, the second doped region could include multiple tips, and each tip of the first doped region could be proximate to one of the tips of the second doped region to form multiple P-I-N structures. The P-I-N structure could also be configured to operate in double avalanche injection conductivity mode with internal positive feedback.

20 Claims, 6 Drawing Sheets

HIGH-SPEED AVALANCHE LIGHT EMITTING DIODE (ALED) AND RELATED APPARATUS AND METHOD

TECHNICAL FIELD

This disclosure is generally directed to light emitting diodes (LEDs). More specifically, this disclosure is directed to a high-speed avalanche light emitting diode (ALED) and related apparatus and method.

BACKGROUND

Avalanche light emitting diodes (ALEDs) are light emitting diodes typically implemented using P-N or P-I-N junctions in silicon or other semiconductor substrates. A P-N junction represents an area where p-type and n-type doped regions contact one another. A P-I-N junction represents an area where p-type and n-type doped regions are separated by a lightly-doped intrinsic region.

Avalanche light emitting diodes often operate using high reverse bias voltages. A high reverse bias voltage typically creates impact ionization within an avalanche light emitting diode. The impact ionization can lead to avalanche multiplication, allowing the avalanche light emitting diode to produce a relatively high level of illumination compared to conventional light emitting diodes.

A problem with conventional avalanche light emitting diodes is that their quantum efficiency is typically quite low. Obtaining higher quantum efficiencies is typically limited by heat dissipation constraints. In other words, obtaining higher quantum efficiencies is typically not possible since higher quantum efficiencies lead to higher temperatures within the avalanche light emitting diodes and the avalanche light emitting diodes lack an effective mechanism for dispersing that heat.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 8, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
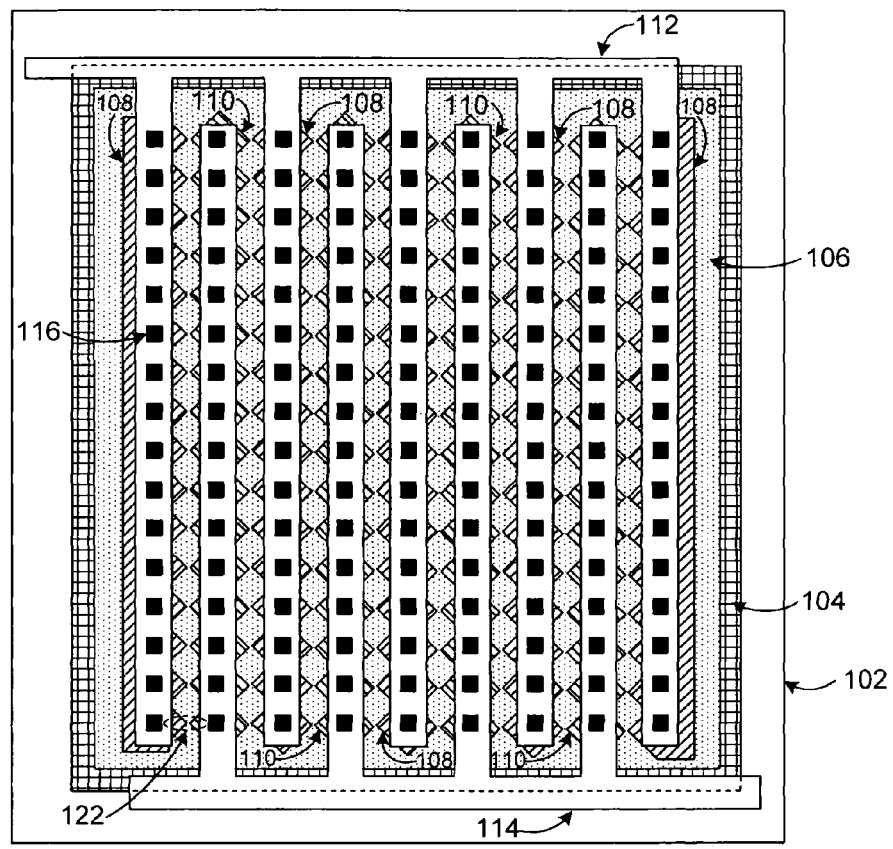
FIGS. 1A through 1C illustrate an example lateral avalanche light emitting diode according to this disclosure.
Figure 1B:
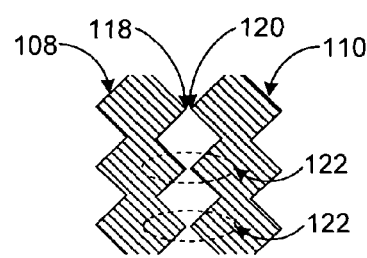
Figure 1C:
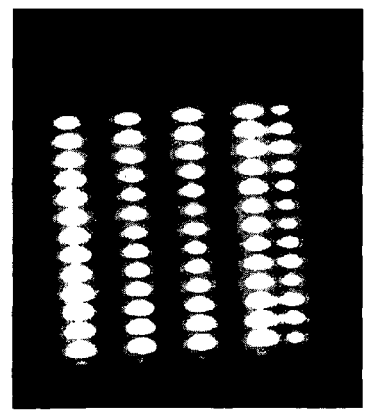

FIGS. 1A through 1C illustrate an example lateral avalanche light emitting diode 100 according to this disclosure. The embodiment of the avalanche light emitting diode 100 shown in FIGS. 1A through 1C is for illustration only. Other embodiments of the avalanche light emitting diode 100 could be used without departing from the scope of this disclosure.

As shown in FIG. 1A, the lateral avalanche light emitting diode 100 is formed within a larger substrate 102. The substrate 102 could represent any suitable semiconductor substrate. As a particular example, the substrate 102 could represent a silicon substrate or a gallium arsenide layer grown over a silicon or other substrate.

An isolation ring 104 is formed within the substrate 102. The isolation ring 104 helps to isolate additional structures formed within the substrate 102 inside the isolation ring 104. The isolation ring 104 could be formed from any suitable material(s) and in any suitable manner. As a particular example, the isolation ring 104 could represent a p+ ring formed using multiple deep trenches in the substrate 102.

A buried layer 106 is formed within the substrate 102 inside the isolation ring 104. The buried layer 106 generally represents a doped region of the substrate 102 formed some distance under a surface of the substrate 102. This allows additional doped regions to be formed in the substrate 102 above the buried layer 106. The buried layer 106 could be formed from any suitable material(s) and in any suitable manner. As a particular example, the buried layer 106 could represent a p-type or n-type buried layer.

Various doped regions are formed in the substrate 102 inside the isolation ring 104 over the buried layer 106. In this example, the doped regions include doped regions 108 interleaved with doped regions 110. Here, the doped regions 108-110 represent regions having different types of dopants. For instance, the doped regions 108 could represent regions doped with P+ dopant(s), and the doped regions 110 could represent regions doped with N+ dopant(s). In FIG. 1A, the doped regions 108-110 represent elongated regions arranged in generally vertical columns, where the doped regions 108 are interleaved with the doped regions 110. The doped regions 108-110 could be formed from any suitable materials and in any suitable manner. As a particular example, each of the doped regions 108-110 could be approximately 26.5 μm long.

An electrode 112 is electrically coupled to the doped regions 108, and an electrode 114 is electrically coupled to the doped regions 110. As shown here, the electrode 112 includes fingers that extend over the doped regions 108. Similarly, the electrode 114 includes fingers that extend over the doped regions 110. The electrodes 112-114 represent conductive structures that can apply voltages to the doped regions 108-110. The electrodes 112-114 could be formed from any suitable conductive material(s) and in any suitable manner. As a particular example, the electrodes 112-114 could be formed from polysilicon.

Various vias 116 provide electrical connection between the electrodes 112-114 and the doped regions 108-110. The vias 116 could be formed from any suitable conductive material(s) and in any suitable manner.

As shown in FIG. 1B, the doped regions 108-110 are configured such that they have tips proximate to each other. In particular, a tip 118 of a doped region 108 is generally positioned near a tip 120 of a doped region 110. In this document, the term "tip" refers to an outermost point or points of a structure. Each of the tips 118-120 in FIG. 1B is shown as being positioned at a point where two generally straight edges of a doped region meet. However, the tips 118-120 could also represent other points, such as at points where curved surfaces peak. Also, the tips 118-120 are shown in FIG. 1B as being aligned horizontally. However, the tips 118-120 could be placed in other positions as long as the tips 118 are near the tips 120. In particular embodiments, a tip 118 of a doped region 108 represents the closest portion of that doped region 108 to a tip 110 of an adjacent doped region 110 in a local area and vice versa. Two tips 118 and 120 could be separated by any suitable distance, such as 0.05-0.15 µm.

In this arrangement, the doped regions 108-110 are used to form multiple P-I-N structures, which are referred to as filaments 122. The intrinsic or "I" regions of the filaments 122 may represent lightly-doped portions of the substrate 102 between the doped regions 108-110. Each filament 122 represents an area where light can be generated when suitable voltages are applied to the electrodes 112-114.

In some embodiments, each filament 122 can be configured to operate in double avalanche injection conductivity mode (DAICM). Internal positive feedback (current instability) within each filament 122 due to double avalanche injection can combine with current spreading effects to result in spatial current instability. This can "pinch" current into each of the filaments 122 when suitable voltages are applied to the electrodes 112-114. With suitable current (such as $10^6$ A/cm$^2$), high-density electron-hole plasma can be generated in each filament 122. Due to the density of the plasma in a filament 122 and the high energy of carriers heated in the breakdown level electric field in the "I" region of its P-I-N structure, recombination can occur that results in luminescence (light) being produced by that filament 122.

An example of this luminescence is shown in FIG. 1C, which illustrates numerous narrow filaments producing illumination. Note that each illuminated filament here could be extremely small, such as 0.1 µm-0.3 µm in width. However, the illuminated filaments are so bright that they saturate the digital camera used to capture the image in FIG. 1C. As a result, the size and shape of the illuminated filaments in FIG. 1C are skewed due to camera saturation.

Because the filaments 122 are narrow, any suitable number of filaments 122 can be distributed over any suitable area to produce any suitable amount of light. Also, these filaments 122 can generate more hole-electron plasma while simultaneously providing for better heat dissipation (since heat can dissipate from each filament 122 radially). As such, the filaments 122 can obtain higher quantum efficiencies while successfully dispersing higher amounts of heat.

In particular embodiments, the filaments 122 operate using internal positive feedback and have self-organized stable states. As such, the filaments 122 produce light based on the current instability effect, rather than on structural inhomogeneities. Also, the filaments 122 implemented in this manner can reduce or eliminate hysteresis when the filaments 122 are turned on. Further, the use of a lateral structure can help to avoid light loss, such as blue or green light loss due to absorption by a silicon substrate 102. In addition, the parameters of the avalanche light emitting diode 100 can be matched so that each filament 122 has the highest possible amplitude.

Although FIGS. 1A through 1C illustrate an example lateral avalanche light emitting diode 100, various changes may be made to FIGS. 1A through 1C. For example, the number, size, and shape of the doped regions 108-110 are for illustration only. Any number of doped regions, each with any suitable size and/or shape, could be used. Also, each electrode 112-114 could include any suitable number of fingers, size, and shape. As a particular example, one doped region 108 and one doped region 110 could be used, where the doped regions 108-110 form three filaments 122 and are 6.1 µm in length. Each electrode 112-114 here would have a single finger over one of the doped regions 108-110. Further, while certain structures have been described above as representing or containing p-type and n-type materials, this is for illustration only. Typically, the p-type and n-type materials can be reversed without adversely affecting the operation of the lateral avalanche light emitting diode 100. In addition, many of the doped regions 108-110 are shown as being formed by overlapping diamond-shaped regions. It may be noted that the diamond-shaped regions or other regions need not overlap. This could allow for the production of columns where each column contains multiple separate doped regions 108 or 110.

FIGS. 2A through 5 illustrate example vertical avalanche light emitting diodes according to this disclosure. The embodiments of the avalanche light emitting diodes shown in FIGS. 2A through 5 are for illustration only. Other embodiments of the avalanche light emitting diodes could be used without departing from the scope of this disclosure.

Figure 2A:
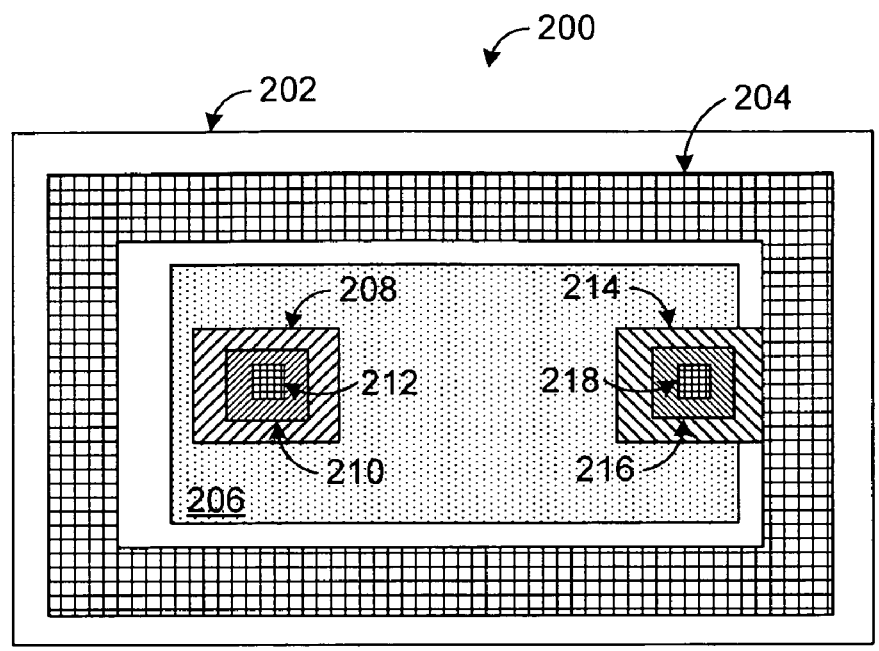
FIGS. 2A through 5 illustrate example vertical avalanche light emitting diodes according to this disclosure.
Figure 2B:
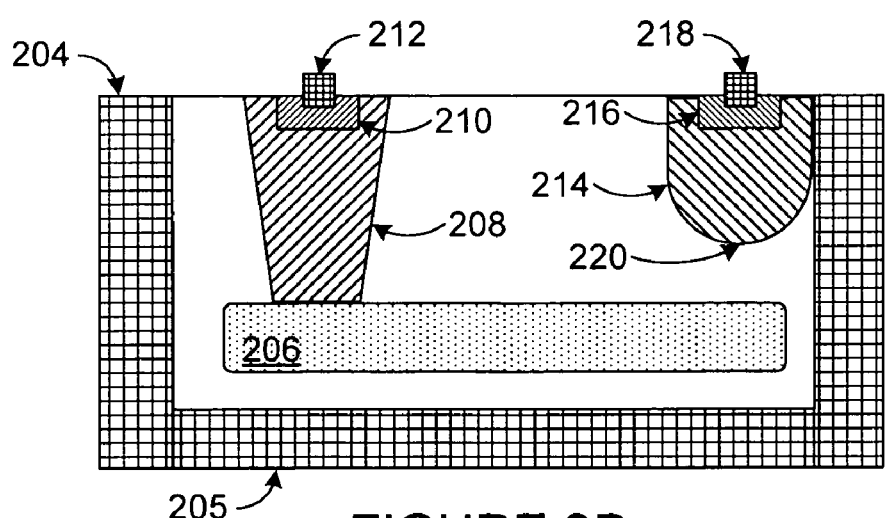

FIGS. 2A and 2B illustrate top and side views, respectively, of a portion of a vertical avalanche light emitting diode 200. In this example, the vertical avalanche light emitting diode 200 is formed in a larger substrate 202, such as a silicon substrate or a gallium arsenide layer grown over a silicon or other substrate. An isolation ring 204, which could represent deep trenches, is formed within the substrate 202 and extends downward to a buried oxide layer 205 within the substrate 202. This effectively isolates the region within the isolation ring 204 and above the buried oxide layer 205. A buried layer 206 is formed in the substrate 202 inside the isolation ring 204 and above the buried oxide layer 205. The buried layer 206 could, for example, represent a p-type or n-type buried layer.

The vertical avalanche light emitting diode 200 also includes a first sinker 208, a first doped region 210 (such as a P+ or N+ region), and a first contact 212. The vertical avalanche light emitting diode 200 further includes a second sinker 214, a second doped region 216 (such as an N+ or P+ region), and a second contact 218. The first sinker 208 represents a region of the substrate 202 that is lightly doped and that extends downward towards the buried layer 206. The first doped region 210 represents a shallower region of the substrate 202 that is more heavily doped. Similarly, the second sinker 214 represents a region of the substrate 202 that is lightly doped and that extends downward towards the buried layer 206, while the second doped region 216 represents a shallower region of the substrate 202 that is more heavily doped.

The type of doping used in the components 206-210 and 214-216 can vary depending on the configuration. For instance, the first sinker 208, the first doped region 210, and the buried layer 206 could have p-type dopant(s), and the second sinker 214 and the second doped region 216 could have n-type dopant(s). Alternatively, the first sinker 208, the first doped region 210, and the buried layer 206 could have n-type dopant(s), and the second sinker 214 and the second doped region 216 could have p-type dopant(s). The contacts 212 and 218 provide for electrical connection to the doped regions 210 and 216.

As shown in FIG. 2B, the sinker 214 includes a peak 220 proximate to the buried layer 206, and the components 206-210 and 214-216 form a P-I-N structure. For instance, the components 206-210 could form the "P" region of the P-I-N structure, and the components 214-216 could form the "N" region of the P-I-N structure. Alternatively, the components 206-210 could form the "N" region of the P-I-N structure, and the components 214-216 could form the "P" region of the P-I-N structure. In any case, luminescence can be generated between the buried layer 206 and the sinker 214. The tip 220 of the sinker 214 can facilitate the generation of the luminescence in a similar manner as that described above.

In this example, the sinker 214 is formed near and may actually contact a wall of the isolation ring 204. Also, the width and length of the sinker 214 (as seen in FIG. 2A) can be used to control the operation of the avalanche light emitting diode 200. In addition, while luminescence is generated at a single point in the avalanche light emitting diode 200, various structures could be replicated (either inside a single isolated region or in multiple isolated regions of the substrate 202) to produce illumination at multiple points.

Figure 3A:
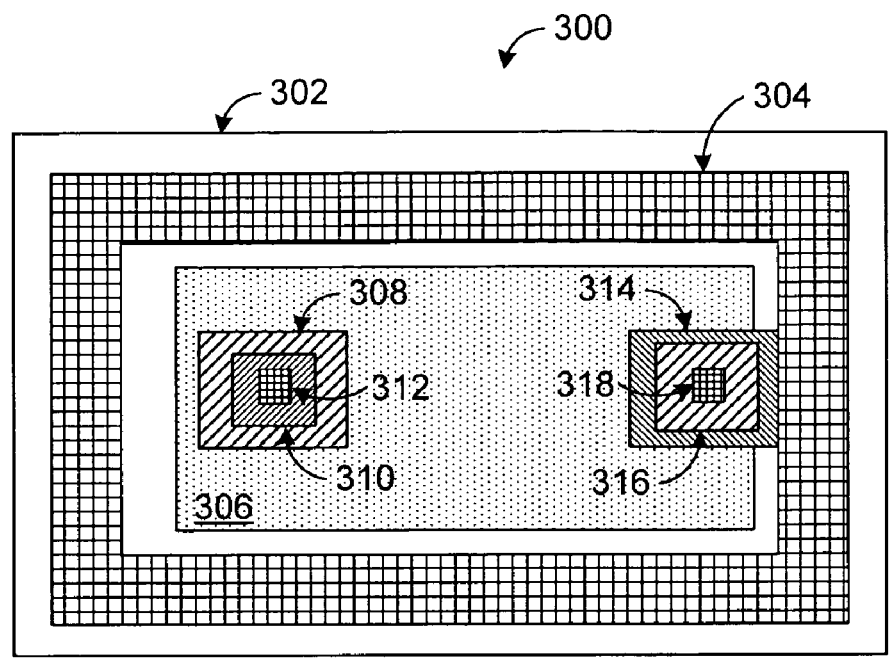
Figure 3B:
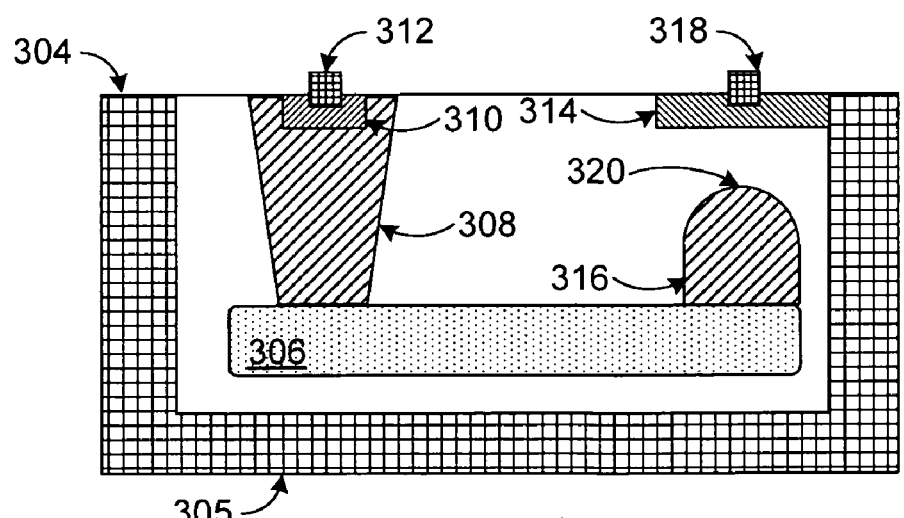

FIGS. 3A and 3B illustrate top and side views, respectively, of a portion of another vertical avalanche light emitting diode 300. In this example, the avalanche light emitting diode 300 is formed in a larger substrate 302 and includes an isolation ring 304 and a buried oxide layer 305 formed within the substrate 302. A buried layer 306 is formed in the substrate 302 inside the isolation ring 304 and above the buried oxide layer 305.

The vertical avalanche light emitting diode 300 also includes a first sinker 308, a first doped region 310 (such as a P+ or N+ region), and a first contact 312. The vertical avalanche light emitting diode 300 further includes a second doped region 314 (such as an N+ or P+ region), a second sinker 316, and a second contact 318. The first sinker 308, the first doped region 310, and the first contact 312 may be the same as or similar to the corresponding components in FIGS. 2A and 2B.

The second sinker 316 represents a region of the substrate 302 that is lightly doped, while the second doped region 314 represents a shallower region of the substrate 302 that is more heavily doped. Unlike in FIGS. 2A and 2B, the sinker 316 here extends upward from the buried layer 306, and the second doped region 314 is wider than the second sinker 316.

Again, the type of doping used can vary depending on the configuration. For instance, the first sinker 308, the first doped region 310, the buried layer 306, and the second sinker 316 could have p-type dopant(s), and the second doped region 314 could have n-type dopant(s). Alternatively, the first sinker 308, the first doped region 310, the buried layer 306, and the second sinker 316 could have n-type dopant(s), and the second doped region 314 could have p-type dopant(s). The contacts 312 and 318 provide for electrical connection to the doped regions 310 and 314.

In this example, the second sinker 316 includes a peak 320, but here the peak 320 is proximate to the second doped region 314. However, the components 306-310 and 314-316 still form a P-I-N structure. For instance, the components 306-310 and 316 could form the "P" region of the P-I-N structure, and the component 314 could form the region of the P-I-N structure. Alternatively, the components 306-310 and 316 could form the "N" region of the P-I-N structure, and the component 314 could form the "P" region of the P-I-N structure. In any case, luminescence can be generated between the sinker 316 and the doped region 314. The tip 320 of the sinker 316 can facilitate the generation of the luminescence in a similar manner as that described above.

In this example, the sinker 316 and the doped region 314 are formed near a wall of the isolation ring 304. Also, the width and length of the sinker 316 (as seen in FIG. 3A) can be used to control the operation of the avalanche light emitting diode 300. In addition, while luminescence is generated at a single point in FIGS. 3A and 3B, various structures could be replicated (either inside a single isolated region or in multiple isolated regions of the substrate 302) to produce illumination at multiple points.

Figure 4:
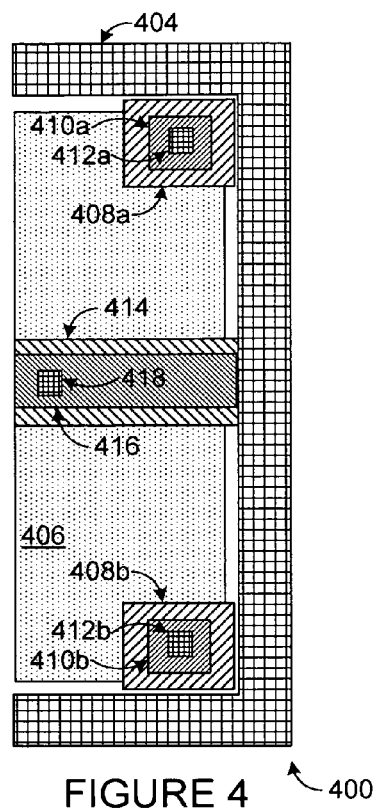

FIG. 4 illustrates a top view of a portion of a vertical avalanche light emitting diode 400. In this example, the avalanche light emitting diode 400 includes an isolation ring 404 and a buried layer 406. The avalanche light emitting diode 400 also includes first sinkers 408*a*-408*b*, first doped regions 410*a*-410*b* (such as P+ or N+ regions), and first contacts 412*a*-412*b*. These components could be the same as or similar to the sinker 208, doped region 210, and contact 212 shown in FIGS. 2A and 2B (except there are two of each component in FIG. 4). The avalanche light emitting diode 400 further includes a second sinker 414, a second doped region 416 (such as an N+ or P+ region), and a second contact 418. These could be the same as or similar to the sinker 214, doped region 216, and contact 218 shown in FIGS. 2A and 2B (except the sinker 414 and the doped region 416 are wider in FIG. 4). In this example, luminescence can be generated at multiple points within the vertical avalanche light emitting diode 400.

Figure 5:
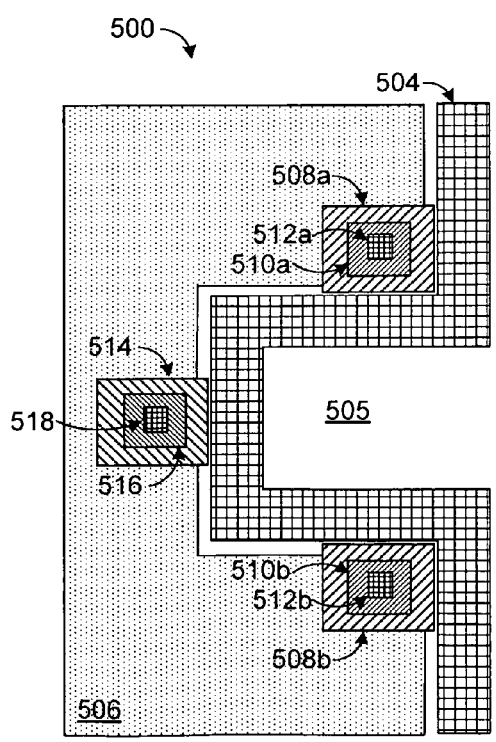

FIG. 5 illustrates a top view of a portion of another vertical avalanche light emitting diode 500. In this example, the avalanche light emitting diode 500 includes an isolation ring 504 with a notch 505 and a buried layer 506. The avalanche light emitting diode 500 also includes first sinkers 508*a*-508*b*, first doped regions 510*a*-510*b* (such as P+ or N+ regions), and first contacts 512*a*-512*b*. These components could be the same as or similar to the corresponding components shown in FIG. 4. The avalanche light emitting diode 500 further includes a second sinker 514, a second doped region 516 (such as an N+ or P+ region), and a second contact 518. These could be the same as or similar to the corresponding components in FIGS. 2A and 2B. Again, in this example, luminescence can be generated at multiple points within the vertical avalanche light emitting diode 500.

In each of these vertical avalanche light emitting diodes, a vertical tip formed on a sinker (either an upward or downward sinker) can be used to facilitate the generation of luminescence. The luminescence produced here might appear more like illuminated points rather than illuminated stripes.

Although FIGS. 2A through 5 illustrate example vertical avalanche light emitting diodes, various changes may be made to FIGS. 2A through 5. For example, the number, size, and shape of each component shown in FIGS. 2A through 5 are for illustration only and could vary depending on the implementation.

Figure 6:
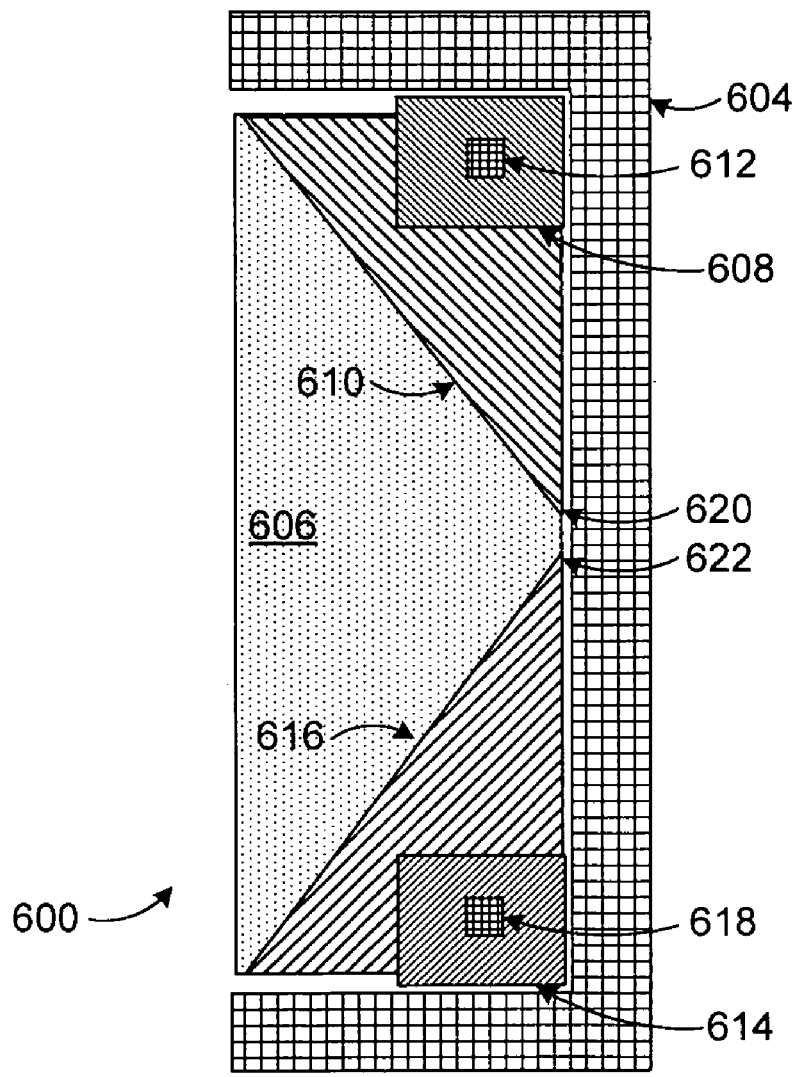
FIG. 6 illustrates another example lateral avalanche light emitting diode according to this disclosure.

FIG. 6 illustrates another example lateral avalanche light emitting diode 600 according to this disclosure. In particular, FIG. 6 illustrates a top view of a portion of a lateral avalanche light emitting diode 600. The embodiment of the avalanche light emitting diode 600 shown in FIG. 6 is for illustration only. Other embodiments of the avalanche light emitting diode 600 could be used without departing from the scope of this disclosure.

In this example, the avalanche light emitting diode 600 includes an isolation ring 604 and a buried layer 606. The avalanche light emitting diode 600 also includes a first sinker 608, a first doped region 610 (such as P+ or N+ regions), and a first contact 612. The avalanche light emitting diode 600 further includes a second sinker 614, a second doped region 616 (such as an N+ or P+ region), and a second contact 618.

As shown in FIG. 6, the doped regions 610 and 616 have tips 620-622, respectively. The tips 620-622 are proximate to each other, and luminescence can be generated between the tips 620-622.

Although FIG. 6 illustrates another example lateral avalanche light emitting diode 600, various changes may be made to FIG. 6. For example, the number, size, and shape of each component shown in FIG. 6 are for illustration only and could vary depending on the implementation.

Figure 7:
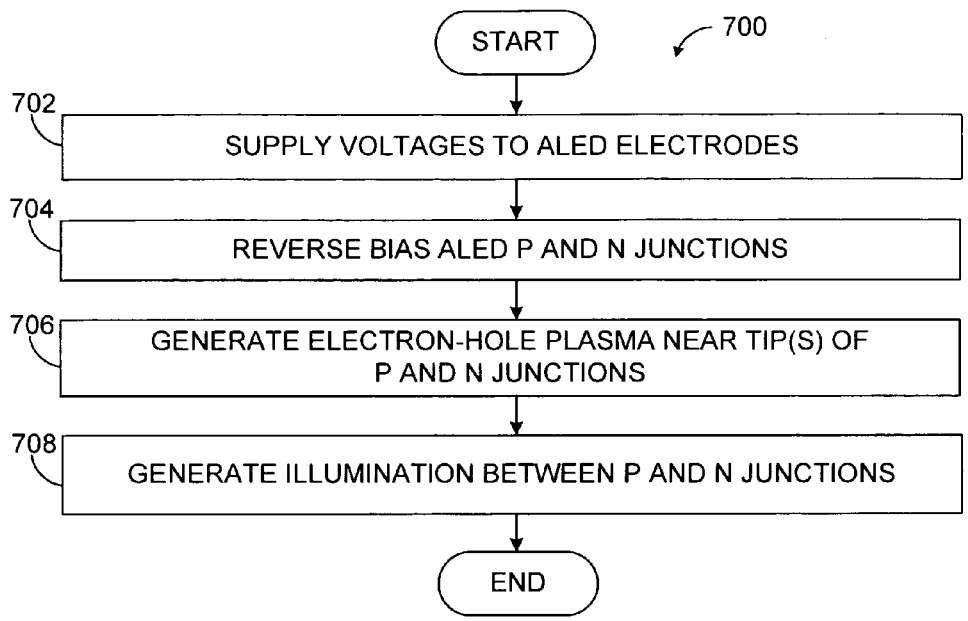
FIG. 7 illustrates an example method for generating illumination using an avalanche light emitting diode according to this disclosure.

FIG. 7 illustrates an example method 700 for generating illumination using an avalanche light emitting diode according to this disclosure. The embodiment of the method 700 shown in FIG. 7 is for illustration only. Other embodiments of the method 700 could be used without departing from the scope of this disclosure. Also, for ease of explanation, the method 700 is described with respect to the lateral avalanche light emitting diode 100 shown in FIGS. 1A through 1C. The method 700 could be used with any other suitable avalanche light emitting diode (such as any of those shown in FIGS. 2A through 6). The method 700 could also be used with any number of avalanche light emitting diodes.

Voltages are provided to electrodes of an avalanche light emitting diode at step 702. This could include, for example, providing voltages to the electrodes 112-114 of the avalanche light emitting diode 100. P and N junctions of the avalanche light emitting diode are reverse biased at step 704. This could include, for example, providing the voltages from the electrodes 112-114 to the doped regions 108-110. The voltages create a reverse voltage bias in the doped regions 108-110, which could represent interleaved P+ and N+ doped regions.

Electron-hole plasma is generated near one or more tips of the P and N junctions at step 706. This could include, for example, internal positive feedback due to double avalanche injection combining with current spreading effects, which results in spatial current instability and pinches current into the intrinsic region between the P and N junctions. When the current density becomes large enough, this generates the plasma in the intrinsic region. Illumination is generated between the P and N junctions at step 708. This could include, for example, electron-hole recombination occurring in the intrinsic region between the P and N junctions, which leads to the generation of luminescence in the intrinsic region.

Although FIG. 7 illustrates an example method 700 for generating illumination using an avalanche light emitting diode, various changes may be made to FIG. 7. For example, while shown as a series of steps, various steps in FIG. 7 could overlap, occur in parallel, occur multiple times, or occur in a different order.

Figure 8:
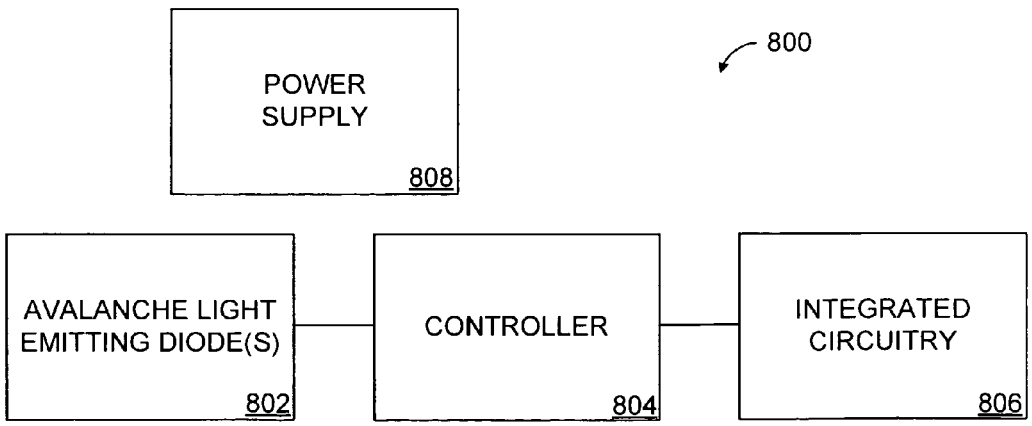
FIG. 8 illustrates an example system using at least one avalanche light emitting diode according to this disclosure.

FIG. 8 illustrates an example system 800 using at least one avalanche light emitting diode according to this disclosure. The embodiment of the system 800 shown in FIG. 8 is for illustration only. Other embodiments of the system 800 could be used without departing from the scope of this disclosure.

In this example, the system 800 includes one or more avalanche light emitting diodes 802, a controller 804, integrated circuitry 806, and a power supply 808. The avalanche light emitting diodes 802 may represent one or more of the avalanche light emitting diodes shown in FIGS. 1A through 6 and described above. The controller 804 controls the operation of the avalanche light emitting diodes 802, such as by providing suitable voltages to electrodes of the avalanche light emitting diodes 802 at appropriate times. The controller 804 includes any suitable structure for controlling operation of one or more avalanche light emitting diodes, such as a microprocessor, microcontroller, digital signal processor, field programmable gate array, or application specific integrated circuit.

The integrated circuitry 806 generally denotes any suitable circuitry or other structures that trigger or otherwise use illumination of the avalanche light emitting diodes 802. For example, the integrated circuitry 806 could trigger illumination of different avalanche light emitting diodes 802 to denote different statuses or conditions of the integrated circuitry 806. Trigger signals could be provided to the controller 804 in order to trigger illumination of the appropriate avalanche light emitting diode(s) 802. The integrated circuitry 806 includes any suitable structure for triggering or otherwise using illumination from one or more avalanche light emitting diodes.

The power supply 808 supplies power to various components of the system 800. For example, the power supply 808 could provide voltages to the controller 804 for use in illuminating the avalanche light emitting diodes 802. The power supply 808 includes any suitable source of power, such as a battery or AC/DC converter.

Although FIG. 8 illustrates an example system 800 using at least one avalanche light emitting diode, various changes may be made to FIG. 8. For example, avalanche light emitting diodes could be used in any other suitable device or system. Also, various components shown in FIG. 8 could be combined, omitted, or further subdivided and additional components could be added according to particular needs.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A circuit comprising:
   multiple doped regions in a substrate, a first of the doped regions having a tip proximate to a second of the doped regions and separated from the second doped region by an intrinsic region to form a P-I-N structure; and
   a first electrode electrically coupled to the first doped region and a second electrode electrically coupled to the second doped region, wherein the electrodes are configured to supply voltages to the first and second doped regions to reverse bias the P-I-N structure and generate light.

2. The circuit of claim 1, wherein the second doped region has a tip proximate to the tip of the first doped region.

3. The circuit of claim 2, wherein:
   the first doped region comprises multiple tips;
   the second doped region comprises multiple tips; and
   each tip of the first doped region is proximate to one of the tips of the second doped region to form multiple P-I-N structures.

4. The circuit of claim 3, wherein:
   the first doped region comprises one of multiple P+ doped regions;
   the second doped region comprises one of multiple N+ doped regions; and
   the P+ doped regions are interleaved with the N+ doped regions.

5. The circuit of claim 2, wherein the tips of the doped regions are located next to a trench in the substrate.

6. The circuit of claim 1, wherein the tip comprises a peak of a sinker formed above a buried doped region in the substrate.

7. The circuit of claim 6, wherein the sinker is located next to a trench in the substrate.

8. The circuit of claim 1, wherein the P-I-N structure is configured to operate in double avalanche injection conductivity mode with internal positive feedback.

9. The circuit of claim 1, wherein the P-I-N structure comprises a cylindrical filament having a width no greater than 0.3 μm.

10. A system comprising:
an avalanche light emitting diode that comprises:
multiple doped regions in a substrate, a first of the doped regions having a tip proximate to a second of the doped regions and separated from the second doped region by an intrinsic region to form a P-I-N structure; and
a first electrode electrically coupled to the first doped region and a second electrode electrically coupled to the second doped region; and
a controller configured to supply voltages to the electrodes of the avalanche light emitting diode to reverse bias the P-I-N structure and generate light in the avalanche light emitting diode.

11. The system of claim 10, wherein the second doped region has a tip proximate to the tip of the first doped region.

12. The system of claim 11, wherein:
the first doped region comprises multiple tips;
the second doped region comprises multiple tips; and
each tip of the first doped region is proximate to one of the tips of the second doped region to form multiple P-I-N structures.

13. The system of claim 12, wherein:
the first doped region comprises one of multiple P+ doped regions;
the second doped region comprises one of multiple N+ doped regions; and
the P+ doped regions are interleaved with the N+ doped regions.

14. The system of claim 11, wherein the tips of the doped regions are located next to a trench in the substrate.

15. The system of claim 10, wherein the tip comprises a peak of a sinker formed above a buried doped region in the substrate.

16. The system of claim 10, wherein the P-I-N structure is configured to operate in double avalanche injection conductivity mode with internal positive feedback.

17. The system of claim 10, further comprising:
integrated circuitry configured to trigger illumination of the avalanche light emitting diode by the controller.

18. A method comprising:
applying a reverse bias voltage across doped regions of a substrate, a first of the doped regions having a tip proximate to a second of the doped regions and separated from the second doped region by an intrinsic region to form a P-I-N structure;
generating a current through the intrinsic region of the P-I-N structure; and
generating luminescence in the intrinsic region of the P-I-N structure based on the current.

19. The method of claim 18, wherein generating the luminescence comprises operating the P-I-N structure in double avalanche injection conductivity mode with internal positive feedback to produce plasma.

20. The method of claim 18, wherein:
the first doped region comprises multiple tips;
the second doped region comprises multiple tips;
each tip of the first doped region is proximate to one of the tips of the second doped region to form multiple P-I-N structures; and
generating the luminescence comprises generating the luminescence at multiple ones of the P-I-N structures.

* * * * *